United States Patent [19]

Malhi et al.

[11] 4,450,366

[45] May 22, 1984

[54] IMPROVED CURRENT MIRROR BIASING ARRANGEMENT FOR INTEGRATED CIRCUITS

[76] Inventors: Satwinder D. Malhi, 24 Brunswick Ave., Toronto, Ontario, Canada, M5S 2L7; Clement A. Salama, 66 Castlewood Rd., Toronto, Ontario, Canada, M5N 2L2

[21] Appl. No.: 304,999

[22] Filed: Sep. 23, 1981

[30] Foreign Application Priority Data

Sep. 26, 1980 [CA] Canada .................................. 362481

[51] Int. Cl.³ ........................ H03F 3/345; H03F 3/16; H03L 5/00

[52] U.S. Cl. .................................... 307/297; 307/495; 323/315; 330/257; 330/288; 330/300

[58] Field of Search ................ 307/297, 491, 495–497, 307/499–501, 355, 362, 570; 323/312, 315–317; 330/257, 288, 299, 300

[56] References Cited

U.S. PATENT DOCUMENTS 3,875,430 4/1975 Prak .................................... 307/297
4,066,917 1/1978 Compton et al. ................. 357/43 X
4,176,368 11/1979 Compton .......................... 357/43 X
4,207,537 6/1980 Cave et al. ....................... 330/257 X
4,276,515 6/1981 Nishimoto ........................ 330/257 X

FOREIGN PATENT DOCUMENTS 2307264 8/1974 Fed. Rep. of Germany ...... 323/312

*Primary Examiner*—Larry N. Anagnos
*Assistant Examiner*—David R. Hudspeth

[57] ABSTRACT

A current mirror biasing arrangement for an electronic circuit, particularly one intended for an integrated circuit employs a current mirror constituted by series connected pnp and npn transistors having their collectors connected together. A pair of series-connected field effect transistors (FET) connected between a voltage source and ground have their gates connected to the emitter and collector of the pnp transistor and their junction to the pnp transistor base. The pnp transistors to be biased have their bases connected to the said FET junction. The gate current of the operative FET can be made negligible so that substantially perfect matching is obtained between the npn transistor current and the "mirror" biasing current. Preferably the FET are of subsurface junction type, their low pinch-off voltage and low gate current making them particularly suitable for low voltage application.

6 Claims, 5 Drawing Figures

IMPROVED CURRENT MIRROR BIASING ARRANGEMENT FOR INTEGRATED CIRCUITS

FIELD OF THE INVENTION

The present invention is concerned with improvements in or relating to biasing arrangements for electronic circuits, particularly such arrangements for integrated circuits.

REVIEW OF THE PRIOR ART

In the design of linear integrated circuits, one of the important requirements is to properly bias the devices of the circuit at their respective required operating points. One of the prevalent methods of such biasing is by the use of matched current sources or sinks to ensure correspondingly well matched biasing currents in two or more branches of the circuit. These matched current sources or sinks are generally referred to in the industry as current mirrors; the degree of matching of the currents in the various branches of a current mirror is a measure of its usefulness. In addition, a good current mirror should have a minimum voltage drop across it.

DEFINITION OF THE INVENTION

It is therefore an object of the invention to provide a new current mirror biasing arrangement for electronic circuits.

It is a specific object to provide a new such biasing arrangement especially suited for low voltage micropower application in an integrated circuit.

It is a more specific object to provide a new biasing arrangement as specified above employing a bipolar field effect transistor (BIFET) as the active element thereof.

In accordance with the present invention there is provided a biased electronic circuit of current mirror type comprising:

(a) an pnp transistor having its emitter connected to a voltage source;

(b) an npn transistor having its collector connected to the collector of the pnp transistor;

(c) two series connected field effect transistors connected between the said voltage source and a ground relative to the voltage source, the gates of the field effect transistors being connected respectively to the emitter and collector of the pnp transistor and the base of the pnp transistor being connected to the junction of the two field effect transistors;

(d) at least one other pnp transistor having its base connected to the base of the first-mentioned pnp transistor for supply of bias voltage therefrom; and (e) at least the field effect transistor having its gate connected to the pnp transistor collector being operated at negligible gate current whereby the collector current of the npn transistor determines the said bias voltage.

DESCRIPTION OF THE DRAWINGS

Biasing arrangements which are particular preferred embodiments of the invention will now be described, by way of example, with reference to the accompanying schematic drawings wherein.

DESCRIPTION OF THE PREFERRED EMBODIMENTS

Figure 1A:
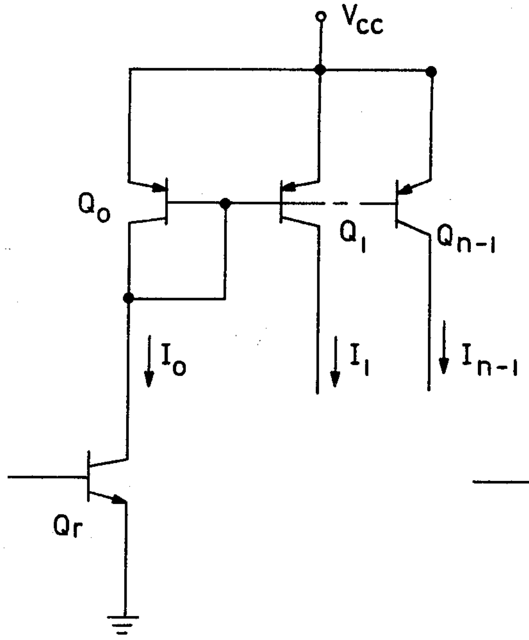
FIGS. 1(*a*) and 1(*b*) are examples of prior art biasing arrangements.
Figure 1B:
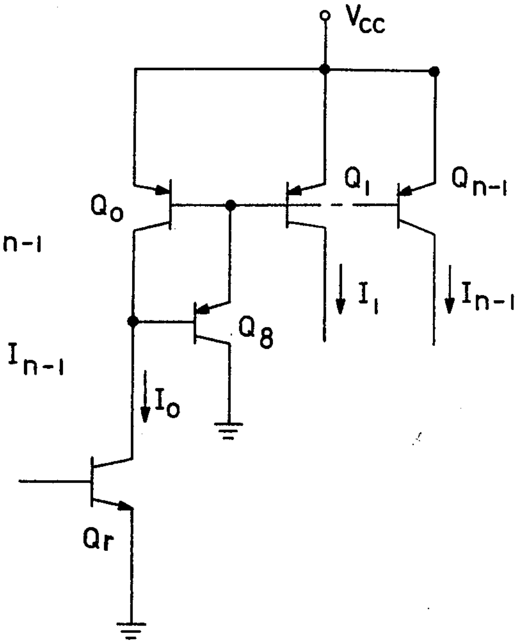

FIG. 1(*a*) shows two pnp transistors $Q_1$ and $Q_{n-1}$ of a string of n such transistors to be supplied with base currents $I_I$ and $I_{n-1}$ respectively.

The prior art current mirror arrangement of FIG. 1(*a*) employs a current setting pnp transistor $Q_o$ having its base and collector connected so that it functions as a diode. The transistor $Q_o$ is connected in series with an npn transistor $Q_r$ which controls the current through $Q_o$ and therefore sets the base emitter voltage across $Q_o$, causing the same collector current to flow in the pnp transistors $Q_n$ as in $Q_o$. In this case, the ratio of the current $I_o$ set by $Q_r$ to the matching current $I_1$ is given by the relation.

$$\frac{I_1}{I_o} = \frac{B}{B+n} \tag{1}$$

where B is the dc common emitter current gain of the pnp transistors and n is the total number of identical pnp transistors in the string. The minimum voltage required for the operation of this current mirror is $V_{BE}+V_{CE(sat)}$, where $V_{BE}$ is the voltage drop across the base-emitter of the pnp transistor $Q_o$ and $(V_{CE})_{sat}$ is the collector-emitter saturation voltage of the npn transistor $Q_r$.

An improved version of this prior art current mirror is shown in FIG. 1(*b*). Here an additional pnp transistor $Q_b$ is used instead of a short circuit to bleed the base current of transistor $Q_o$ and improve the current matching which is now given by $$\frac{I_1}{I_o} = \frac{B(B+1)}{B(B+1)+n} \tag{2}$$

However, the minimum voltage required to operate the current mirror in this case is $2V_{BE}+(V_{CE})_{sat}$. Such an arrangement is readily usable if substantial operating voltages are available, but becomes much more difficult to realise in practice when the supply voltage is limited, for example, to that obtainable from a single cell.

Figure 2:
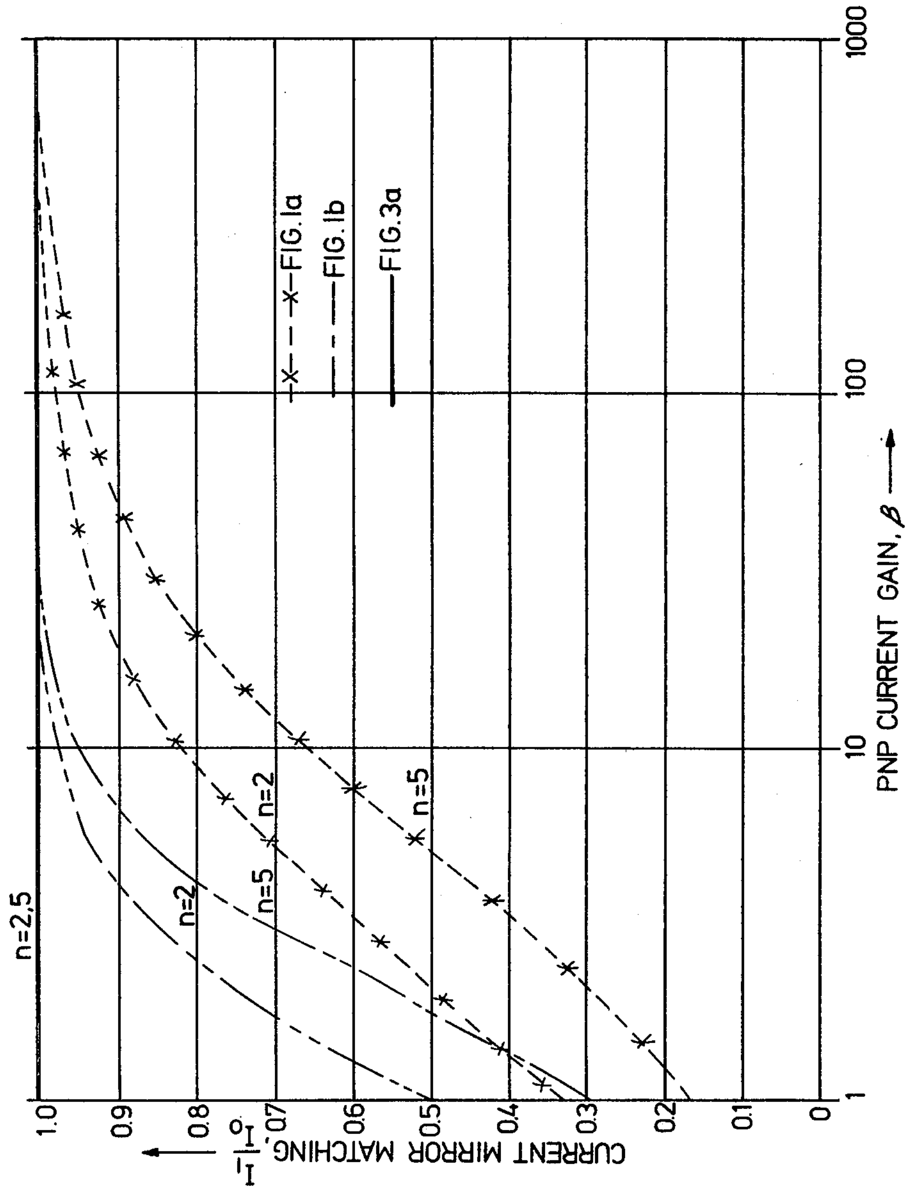
FIG. 2 is a graph illustrating the current matching ratio obtainable with prior art circuits and those of the present invention, and FIGS. 3(*a*) and 3(*b*) are embodiments of the present invention.

FIG. 2 shows the current matching for the prior art mirrors of FIGS. 1(*a*) and 1(*b*) as a function of B for two values of n, namely n=d and n=5. The characteristics for the arrangement of FIG. 1(*b*) are shown in plain broken lines, while those for the arrangement of FIG. 1(*a*) are shown in broken lines with cross intersections. As can be seen the matching is particularly poor at low values of pnp B(B<25) typical of current integrated circuit technology and becomes worse for large values of n.

Figure 3A:
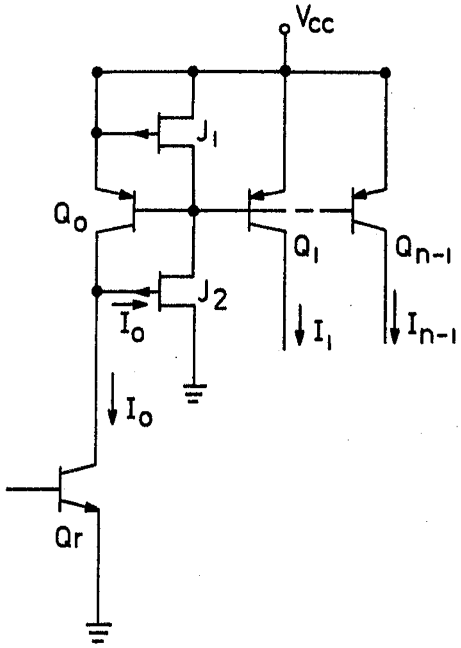
Figure 3B:
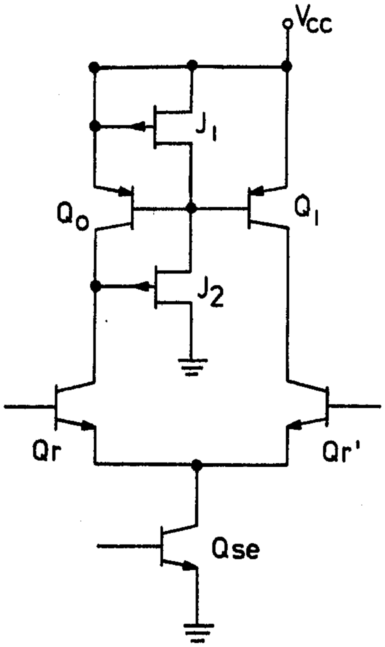

Referring now to FIG. 3(*a*) a biasing arrangement of the invention employs two junction field effect transistors $J_1$ and $J_2$ in circuit with transistors $Q_o$ and $Q_r$ to produce the current mirror. Because of the low voltage requirement the field effect transistors are of low voltage type and, in particular are junction field effect transistors of low pinch-off voltage. It will be seen that the pnp transistor of FIG. 1(*b*) is replaced by transistor $J_2$ and in addition transistor $J_1$ is connected between the voltage source Vcc and the base of transistor $Q_o$ with its base and one terminal shunted together and connected to the emitter of transistor $Q_o$. Field effect transistors are essentially very low gate current devices and the configuration employed ensures that it is at a minimum value. Thus, the current matching of this mirror arrangement is given by $$\frac{I_1}{I_o} = 1 + \frac{I_G}{I_o} \quad (3)$$

where $I_G$ is the gate current of transistor $J_2$. Both transistors $J_1$ and $J_2$ are operating in their saturation regions with drain currents much greater than the base currents of the pnp transistors in the bias string. Preferably, $J_1$ and $J_2$ are identical long channel devices with equal aspect ratios (channel width to channel length ratio). If the aspect ratios of the two devices are so chosen that $$B^*V_P^2 >> \frac{nI_o}{B} \quad (4)$$

where B* is the gain constant of the JFETs, then the gate $J_2$ is always reverse biased. For a reverse biased gate junction of $J_2$, the gate current $I_G$ is negligible in that it is at least five or six orders of magnitude smaller than $I_o$ and one obtains, even at microampere levels, a current transfer ratio of essentially unity, since the term $I_G/I_o$ becomes essentially zero and $$\frac{I_1}{I_o} = 1 \quad (5)$$

Furthermore, this current transfer ratio is independent of B or n as shown by the corresponding solid line characteristic in FIG. 2. As a result this configuration can effectively be used without degradation of performance even at very low currents where the value of B of the pnp transistor $Q_o$ falls off. The miminum voltage required for the operation of this current mirror is only $V_{BE}+V_{CE(sat)}$. Proper operation at voltages as low as $V_{BE}$ is obtainable by adjusting the aspect ratio of $J_2$ to be higher than that of $J_1$.

A direct application of the concept is the novel differential to single ended conversion module of FIG. 3(*b*) which achieves the conversion without introducing bias mismatches on the two sides of the differential stage. This circuit comprises an npn differential stage with pnp current source loads. The transistor $Q_1$ has an npn transistor $Q_r$ connected in series therewith, the differential circuit feeding to the single end transistor $Q_{se}$. This conversion is achieved without loss of voltage gain while maintaining the balance between the two transistors $Q_o$ and $Q_1$, which is necessary to obtain a low offset voltage.

What we claim:

1. Biased electronic circuit of current mirror type comprising:

(a) an pnp transistor having its emitter connected to a voltage source;

(b) an npn transistor having its collector connected to the collector of the pnp transistor and having its emitter coupled to a reference voltage, and having its base for controlling a current through its collector;

(c) two field effect transistors having their drain-source current paths connected in series said voltage source and said reference voltage, the gates of the field effect transistors being connected respectively to the emitter and collector of the pnp transistor and the base of the pnp transistor being connected to the junction of the two field effect transistors;

(d) at least one other pnp transistor having its base connected to the base of the first-mentioned pnp transistor and having its emitter-collector current path coupled to said voltage source for supply of bias voltage therefrom; and (e) at least the field effect transistor having its base connected to the pnp transistor collector being operated at negligible gate current whereby the collector current of the npn transistor determines the said bias voltage.

2. A circuit as claimed in claim 1, wherein the field effect transistors are of junction type.

3. A circuit as claimed in claims 1 or 3, wherein the field effect transistor are of low pinch-off junction type.

4. A circuit as claimed in any one of claims 1 to 2, wherein the field effect transistors are of equal aspect ratios.

5. A circuit as claimed in any one claims 1 to 2, wherein the field effect transistors are operated in their saturation region with drain current greater than the base current of said at least one other pnp transistor.

6. A circuit as claimed in any one of claims 1 to 2, wherein said one other pnp transistor has its collector connected to the collector of a further npn transistor having its emitter connected to the emitter of the first-mentioned npn transistor, said further npn transistor and said first-mentioned npn transistor having their respective bases coupled to receive a differential input so as to constitute a differential circuit and having a bias current control npn transistor connected between said reference voltage and the junction of the emitters of said further npn transistor and said first-mentioned npn transistors.

* * * * *